United States Patent [19]
Doi

[11] Patent Number: 5,473,112
[45] Date of Patent: Dec. 5, 1995

[54] SECURITY CIRCUITRY WITH SELECT LINE AND DATA LINE SHIELDING

[75] Inventor: Bryan C. Doi, Fremont, Calif.

[73] Assignee: VLSI Technology, Inc., San Jose, Calif.

[21] Appl. No.: 120,622

[22] Filed: Sep. 13, 1993

[51] Int. Cl.$^6$ ............................................. H05K 9/00
[52] U.S. Cl. ........................ 174/35 R; 257/659; 370/6
[58] Field of Search ................. 174/35 R, 35 MS, 174/35 L, 32, 33, 34, 35LF, 36, 104; 333/12; 370/6; 361/800; 257/659

[56] References Cited

U.S. PATENT DOCUMENTS

| | | | |
|---|---|---|---|
| 3,612,744 | 10/1971 | Thomas | 174/36 |
| 4,513,266 | 4/1985 | Ishihara | 333/238 |
| 4,658,334 | 4/1987 | McSparrow et al. | 361/415 |
| 4,845,311 | 7/1989 | Schreiber et al. | 174/36 |
| 4,853,894 | 8/1989 | Yamanaka et al. | 365/154 |
| 4,885,431 | 12/1989 | Kawakami et al. | 174/68.5 |
| 5,166,772 | 11/1992 | Soldier et al. | 257/659 |
| 5,177,324 | 1/1993 | Carr et al. | 174/35 R |
| 5,210,523 | 5/1993 | Tipping | 340/540 |
| 5,223,806 | 6/1993 | Curtis et al. | 333/12 |
| 5,260,128 | 11/1993 | Ishii et al. | 428/328 |
| 5,270,488 | 12/1993 | Ono et al. | 174/35 R |
| 5,270,493 | 12/1993 | Inoue et al. | 174/253 |
| 5,288,949 | 2/1994 | Crafts | 174/250 |

*Primary Examiner*—Morris H. Nimmo
*Assistant Examiner*—Christopher Horgan

[57] ABSTRACT

A method is used to shield a data line in a first metal layer from electrical probe. A first shielding line is placed directly over the data line. The first shielding line is within a second metal layer which is above the first metal layer. In the preferred embodiment, a second shielding line is placed on a first side of the data line. The second shielding line is in the first metal layer. Also, a third shielding line is placed on a second side of the data line. The third shielding line is also in the first metal layer. Also in the preferred embodiment, the first shielding line, the second shielding line and the third shielding line are all connected to Vss.

15 Claims, 3 Drawing Sheets

SECURITY CIRCUITRY WITH SELECT LINE AND DATA LINE SHIELDING

BACKGROUND

The present invention concerns the use of shielding of critical signal lines within circuitry in order to protect against reverse engineering.

A considerable amount of engineering time and expense is required to develop sophisticated devices. Rather than make this investment, some elect to limit costs by reverse-engineering existing designs. It is desirable for those making a significant investment in an original design to make it more difficult to reverse-engineer a product.

Various techniques exist by which logic within a circuit may be disguised so that it is difficult to visually detect logic design. However, the ability to reverse-engineering designs using electrical monitoring and modification of circuits has been aided by such advances in technology as electron beam probing and ion milling.

SUMMARY OF THE INVENTION

In accordance with the preferred embodiment of the present invention, a method is used to shield a data line in a first metal layer from electrical probe. A first shielding line is placed directly over the data line. The first shielding line is within a second metal layer which is above the first metal layer. In the preferred embodiment, a second shielding line is placed on a first side of the data line. The second shielding line is in the first metal layer. Also, a third shielding line is placed on a second side of the data line. The third shielding line is also in the first metal layer. Also in the preferred embodiment, the first shielding line, the second shielding line and the third shielding line are all connected to Vss.

DESCRIPTION OF THE PREFERRED EMBODIMENT

Figure 1:
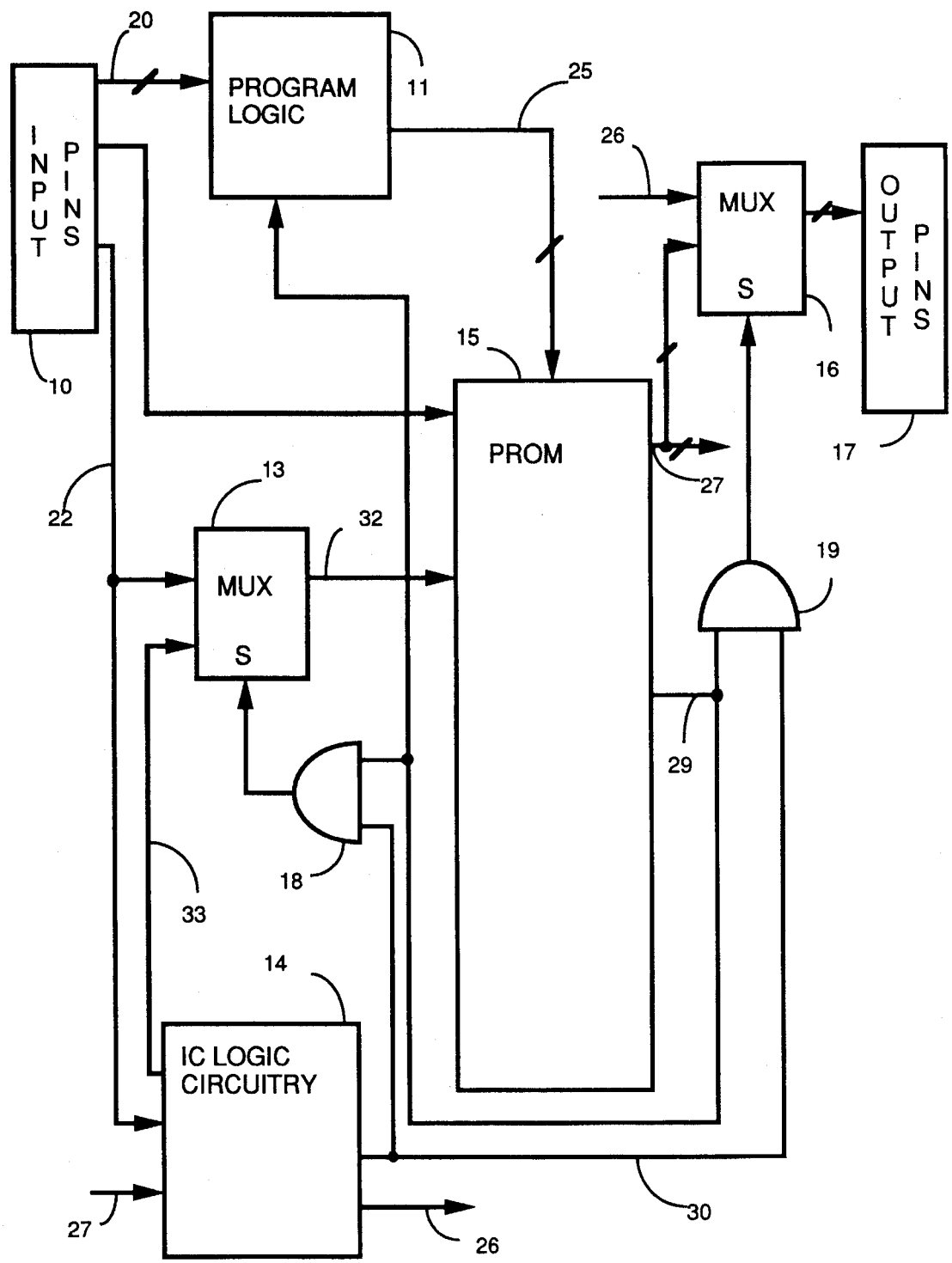
FIG. 1 shows implementation of security logic in an integrated circuit, in accordance with the preferred embodiment of the present invention.

FIG. 1 shows a block diagram of circuitry which implements security for a programmable read only memory (PROM) 15 which is within a VLSI circuit. Integrated circuit (IC) logic circuitry 14 within the VLSI circuit controls operation of the VLSI circuit. Under normal operating conditions, when PROM 15 is accessed, a multiplexor 13 selects an address on lines 33 to be forwarded to PROM 15 on address lines 32. In response, IC logic circuitry 14 receives data from PROM 15 through PROM output lines 27.

Also, under normal operating conditions, IC logic circuitry 14 controls the interface of the VLSI circuit to other devices. IC logic circuitry 14 receives data through input pins 10 via lines 22. A multiplexor 16 selects data on logic output lines 26 to be connected to output pins 17.

When PROM 15 is programmed and verified, multiplexor 13 selects an address on lines 22 from input pins 10 to be forwarded to PROM 15 on address lines 32. Multiplexor 16 selects data on PROM output lines 27 to be connected to output pins 17. In response to values placed on input pins 10 and forwarded to program logic 11 through lines 20, program logic 11 provides programming voltages to PROM 15 through lines 25.

A selection input to multiplexor 13 and a selection input to multiplexor 16 are controlled respectively by a logical AND gate 18 and a logical AND gate 19. Alternately, as will be understood by persons of ordinary skill in the art, the function of logical AND gate 18 and logical AND gate 19 may be accomplished by a single logical AND gate. Logical AND gate 18 and logical AND gate 19 each performs a logical AND operation on a test/program bit and a security bit. The test/program bit is generated by IC logic circuitry 14 and placed on a line 30. The security bit is supplied by PROM 15 and placed on a line 29. Program logic 11 also receives the security bit on line 29 which serves to enable/disable program logic 11.

In the circuitry shown in FIG. 1, when both the test/program bit and the security bit are at logic 1, multiplexor 13 selects an address on lines 22 to be connected to address lines 32 and multiplexor 16 selects data on PROM output lines 27 to be connected to output pins 17. Therefore, memory locations within PROM 15 may be programmed and accessed by devices outside the VLSI circuit. When either the test/program bit or the security bit is at logic 0, multiplexor 13 selects the address on lines 33 to be connected to address lines 32 and multiplexor 16 selects the data on logic output lines 26 to be connected to output pins 17. Therefore, memory locations within PROM 15 cannot be programmed or accessed by devices outside the VLSI circuit.

As may be understood by a person of ordinary skill in the art, while the logic shown assumes the security bit and the test/program bit are active high, the logic shown may be easily modified to accommodate the situation where the security bit and/or the test/program bit are active low.

In order to prevent probing or overriding of multiplexor 13 or multiplexor 16, data shielding may be used on input, output and select lines of each of these multiplexors.

Figure 2:
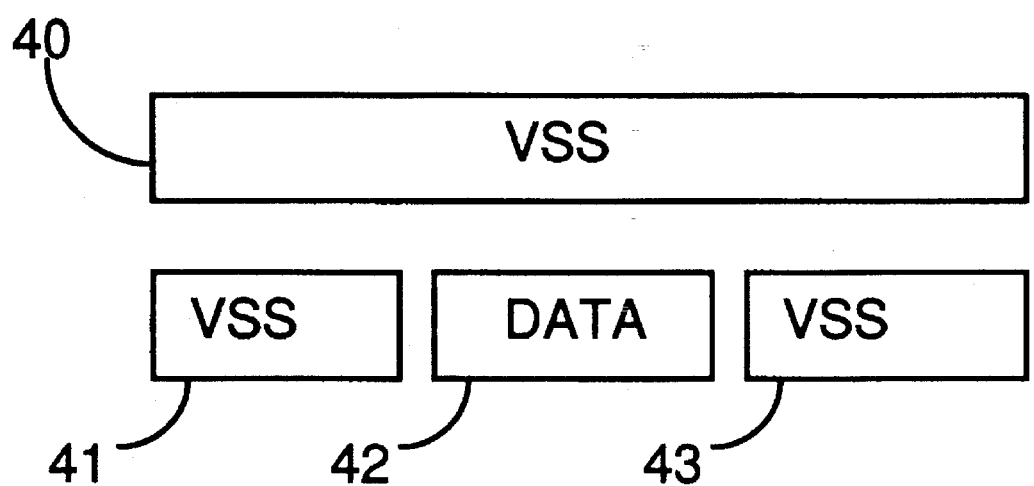
FIG. 2 shows the shielding of a data line with power lines in accordance with the preferred embodiment of the present invention.

FIG. 2 shows how the shielding is implemented in the preferred embodiment of the present invention. A data line 42 within a metal one layer is shielded. Data line 42 may be, for example, an input, an output or a select line of multiplexor 13 or multiplexor 16. Data line 42 is shielded by placing a Vss line 41 and a Vss line 43 immediately adjacent to data line 42 within metal one layer. In addition, in a metal two layer, a Vss line 40 is placed over data line 42, Vss line 41 and a Vss line 43.

While in the preferred embodiment, Vss (logic 0) is chosen to shield data line 42, other signals, for example Vcc (logic 1). May be used. In the preferred embodiment, it is advantageous to use Vss to shield the select line for the select line of multiplexor 13 and multiplexor 16 because in the normal operating mode, the select line of multiplexor 13 and multiplexor 16 are at logic 0. Therefore, any shorting which occurs during ion milling will result in data line 42 being shorted to Vss. This will serve to keep the multiplexors in the normal operating mode.

Figure 3:
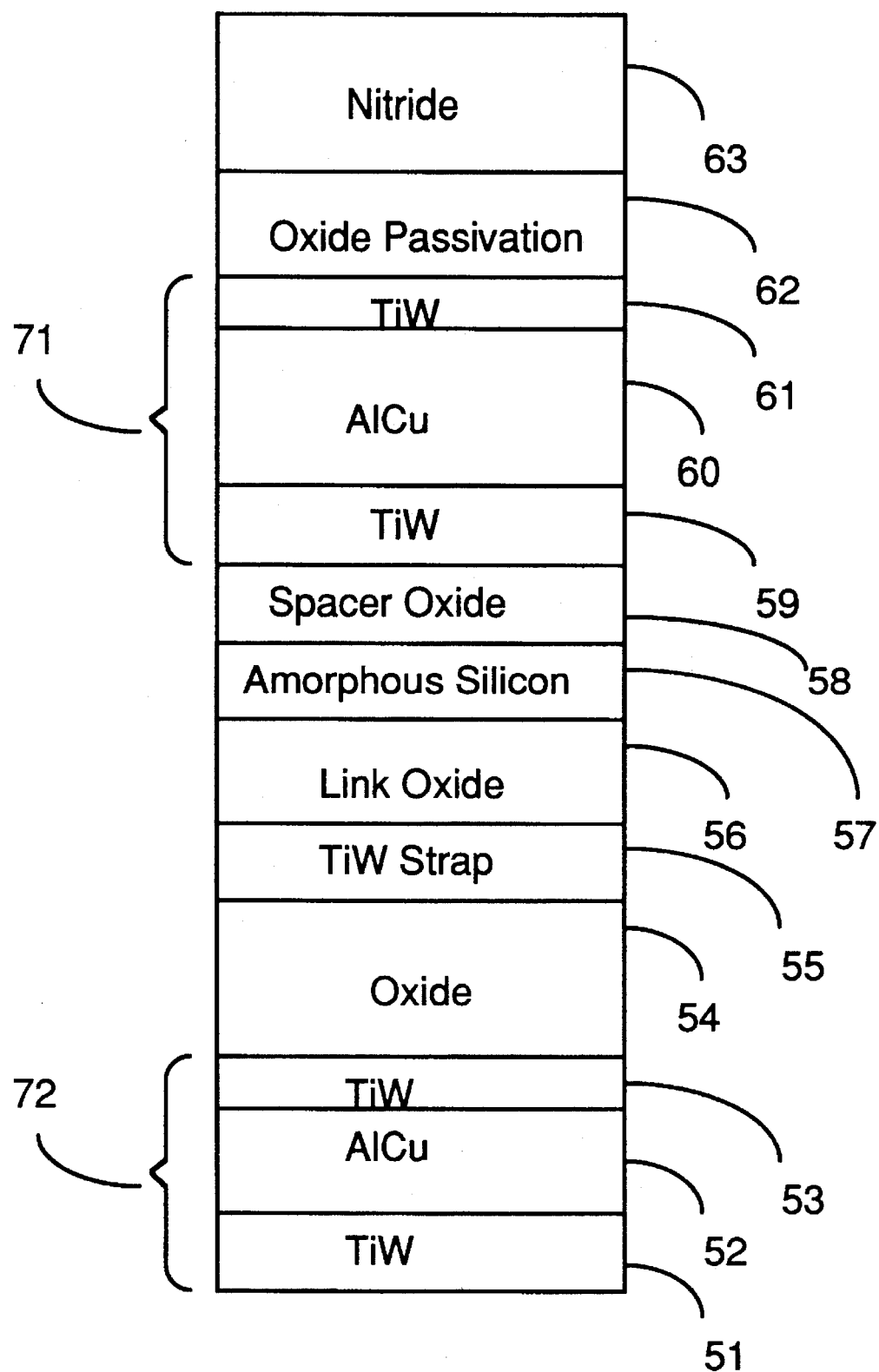
FIG. 3 illustrates process flow to produce the shielding shown in FIG. 2.

FIG. 3 illustrates various processing layers between metal one layer and metal two layer in the preferred embodiment of the present invention. In the preferred embodiment a metal one layer 72 consists of a 1700 Angstroms (Å) thick layer 51 of Titanium Tungsten (TiW), a 4000 Å thick layer 52 of Aluminum Copper (AlCu), and a 750 Å thick layer 53 of Titanium Tungsten. A metal two layer 71 consists of a 1700 Å thick layer 59 of Titanium Tungsten, an 8000 Å thick layer 60 of Aluminum Copper, and a 750 Å thick layer 53 of Titanium Tungsten.

Between metal one layer 72 and metal two layer 71 there is placed various layers used to insulate metal one layer 72 from metal two layer 71, as well to provide fuses for PROM 15. Specifically, an 8000 Å thick oxide layer 54 is placed on top of metal one layer 72. Oxide layer 54 includes top oxide, SOG and base oxide. On top of oxide layer 54 is placed a 2200 Å thick layer 55 which is patterned Titanium Tungsten strap. On top of layer 55 is placed a 3000 Å thick layer 56 of link oxide. After layer 56 is placed an 1850 Å thick layer 57 of amorphous silicon. The amorphous silicon is used as link vias for PROM 15. After layer 57, is placed a 2000 Å thick layer of spacer oxide which is deposited and then etched back On top of metal two layer 71, there is placed a 5000 Å thick layer 62 of oxide passivation. On top of layer 62, there is placed a 9000 Å thick layer 63 of nitride.

While the preferred embodiment has shown an implementation of the present invention in which a multiplexor is shielded, the present invention can be used in other applications. For example, an extra (third) level of metal connected to VSS could be used to cover an entire die. Such a shielding could protect an entire chip from electronic probing. Another, application of the present invention is to stack a line tied to Vss in metal two layer over a sensitive line in metal one layer. The line tied to Vss in metal two layer would be routed exactly over sensitive line in metal one layer.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for manufacturing an integrated circuit comprising the steps of:

(a) forming a first metal layer for the integrated circuitry, including placing a first plurality of data lines within the first metal layer, the first plurality of data lines being for transferring information within the integrated circuit; and, (b) shielding the plurality of data lines from being accessible to an electrical probe, including the substep of:

(b1) forming a second metal layer over the first metal layer, the second metal layer within the integrated circuit and being separated from the first metal layer by an insulating layer, the second metal layer including a first plurality of shielding lines wherein each shielding line from the first plurality of shielding lines is placed directly over a corresponding data line from the plurality of data lines so that each shielding line runs in parallel with the corresponding data line and so that each shielding line is over the corresponding data line for the entire length of the data line.

2. A method as in claim 1 wherein step (b) additionally comprises the substep of:

(b2) when forming the first metal layer in step (a) placing a second plurality of shielding lines in the first metal layer, the second plurality of shielding lines being placed so that two shielding lines run parallel with each data line for the entire length of the data line, one of the two shielding lines being on a first side of the data line and a second of the two shielding lines being on a second side of the data line.

3. A method as in claim 2 additionally comprising the step of:

(c) connecting the first plurality of shielding lines and the second plurality of shielding lines to Vss.

4. A method as in claim 2 wherein substep (b2) includes placing each shielding line from the first plurality of shielding lines with a sufficient width so that in addition to being directly over the corresponding data line, each shielding line from the first plurality of shielding lines is also over the two shielding lines on either side of the corresponding data line.

5. A method as in claim 1 additionally comprising the step of:

(c) connecting the first plurality of shielding lines to Vss.

6. An integrated circuit comprising:

a first metal layer, the first metal layer including a first plurality of data lines, the first plurality of data lines being for transferring information within the integrated circuit; and, a second metal layer over the first metal layer, the second metal layer being separated from the first metal layer by an insulating layer, the second metal layer including a first plurality of shielding lines wherein each shielding line from the first plurality of shielding lines is placed directly over a corresponding data line from the first plurality of data lines so that each shielding line runs in parallel with the corresponding data line and so that each shielding line is over the corresponding data line for the entire length of the data line so that the first plurality of shielding lines shields the plurality of data lines from being accessible to an electrical probe.

7. An integrated circuit as in claim 6 wherein the first metal layer additionally includes:

a second plurality of shielding lines, the second plurality of shielding lines being placed so that two shielding lines run parallel with each data line for the entire length of the data line, one of the two shielding lines being on a first side of the data line and a second of the two shielding lines being on a second side of the data line.

8. An apparatus as in claim 7 wherein the first plurality of shielding lines and the second plurality of shielding lines are connected to Vss.

9. An integrated circuit as in claim 7 wherein each shielding line from the first plurality of shielding lines has a sufficient width so that in addition to being directly over the corresponding data line, each shielding line from the first plurality of shielding lines is also over the two shielding lines on either side of the corresponding data line.

10. An integrated circuit as in claim 6 wherein the first plurality of shielding lines are connected to Vss.

11. A method for manufacturing a multiplexor within an integrated circuit comprising the steps of:

(a) placing input, output and select lines of the multiplexor in a first metal layer of the integrated circuit; and, (b) preventing probing or overriding of a multiplexor including the substep of (b1) placing first shielding lines directly over the input, the output and the select lines of the multiplexor, the first shielding lines being within a second metal layer of the integrated circuit which is above the first metal layer, wherein the first shielding lines run in parallel with the input, the output and the select lines of the multiplexor so that the first shielding lines are over the input, the output and the select lines of the multiplexor for the entire lengths of the input, the output and the select lines of the multiplexor.

12. A method as in claim 11 wherein step (b) additionally comprises the following substeps:

(b2) placing second shielding lines on a first side of the input, the output and the select lines of the multiplexor, the second shielding lines being in the first metal layer, the second shielding lines running in parallel with the input, the output and the select lines of the multiplexor for the entire lengths of the input, the output and the select lines of the multiplexor; and, (b3) placing third shielding lines on a second side of the input, the output and the select lines of the multiplexor, the third shielding lines being in the first metal layer, the third shielding lines running in parallel with the input, the output and the select lines of the multiplexor for the entire lengths of the input, the output and the select lines of the multiplexor.

13. A method as in claim 12 wherein step (b) additionally comprises the following substep:

(b4) connecting the first shielding lines, the second shielding lines and the third shielding lines to Vss.

14. A method as in claim 12 wherein substep (b1) includes placing the first shielding lines with a sufficient width so that the first shielding lines are also over the second shielding lines and the third shielding lines.

15. A method as in claim 11 wherein step (b) additionally comprises the following substep:

(b2) connecting the first shielding lines to Vss.

* * * * *